United States Patent
Tomita

[11] Patent Number: 6,023,101
[45] Date of Patent: Feb. 8, 2000

[54] SEMICONDUCTOR DEVICE AND METHOD FOR MANUFACTURING THE SAME

[75] Inventor: Kazuo Tomita, Tokyo, Japan

[73] Assignee: Mitsubishi Denki Kabushiki Kaisha, Tokyo, Japan

[21] Appl. No.: 09/090,261

[22] Filed: Jun. 4, 1998

[30] Foreign Application Priority Data

Dec. 10, 1997 [JP] Japan ................................. 9-339942

[51] Int. Cl.$^7$ ................................. H01L 23/48
[52] U.S. Cl. ................ 257/773; 257/296; 257/300; 257/306; 257/311; 257/774
[58] Field of Search ..................... 257/296, 308, 257/300, 311, 773, 774, 306, 532, 535

[56] References Cited

U.S. PATENT DOCUMENTS 5,668,412  9/1997  Kim ................................. 257/773
5,742,472  4/1998  Lee et al. ......................... 361/321.4
5,796,133  8/1998  Kwon et al. ..................... 257/295

FOREIGN PATENT DOCUMENTS 8-250589  9/1996  Japan.
8-306664  11/1996  Japan.

Primary Examiner—David B. Hardy
Assistant Examiner—Huy Bui
Attorney, Agent, or Firm—Oblon, Spivak, McClelland, Maier & Neustadt, P.C.

[57] ABSTRACT

A coverage can be improved when an upper layer is formed on an upper wiring patterned on an interlayer insulation film. A sidewall made of an insulating material is bonded to a side face of the upper wiring patterned on the interlayer insulation film. Consequently, a height difference between the upper wiring and the interlayer insulation film has a small gradient. By flattening a laminated face of the upper layers including surfaces of the upper wiring and the sidewall, a further upper layer to be formed can have a coverage improved.

4 Claims, 3 Drawing Sheets

PRIOR ART FIG.6

ND METHOD
SEMICONDUCTOR DEVICE AND METHOD FOR MANUFACTURING THE SAME

BACKGROUND OF THE INVENTION

1. Field of the Invention

The present invention relates to a semiconductor device capable of enhancing a coverage of an upper layer thereof, and a method for manufacturing the semiconductor device.

2. Description of the Background Art

FIG. 6 is a sectional view showing a semiconductor device which has been described in Japanese Unexamined Patent Publication No. 8-306664. In FIG. 6, an upper wiring 105 having a wiring width which is almost equal to a contact diameter is provided on a contact 103 formed through an interlayer insulation film 102 provided on a semiconductor substrate 101, and a contact layer pattern 104 (barrier metal) having a greater width than the wiring width is formed between the upper wiring 105 and the contact 103.

The contact layer pattern 104 is bonded to an area corresponding to a bottom face of the upper wiring 105 and that of a sidewall 107 which is bonded to side faces of the upper wiring 105 and a protective pattern 106 patterned on the upper wiring 105.

In the semiconductor device thus formed, the contact layer pattern 104 has a greater width than the wiring width of the upper wiring 105. Therefore, also in the case where a shift of superposition is caused between the upper wiring 105 and the contact 103, they can be connected well.

In the semiconductor device shown in FIG. 6, the protective pattern 106 made of an insulating film is provided on the upper wiring 105, and a horizontal dimension of the sidewall 107 bonded to a surface of the interlayer insulation film 102 is gained by increasing a vertical dimension of the side face to which the sidewall 107 is bonded, thereby increasing a correction range of the shift of superposition.

However, if the total of thicknesses of the upper wiring 105 and the protective pattern 106 is increased, a surface height difference between the interlayer insulation film 102 and the upper wiring 105 and protective pattern 106 becomes greater. Consequently, it is difficult to form an upper layer with a good coverage.

In the semiconductor device shown in FIG. 6, in the case where a plurality of upper wirings 105 are arranged, wirings are connected (short-circuited) through the contact layer pattern 104 if a distance between the wirings 105 is reduced to a minimum dimension. In order to avoid this problem, a method for keeping a sufficient space between the wirings can be given. However, it is hard to obtain high integration of the semiconductor device.

SUMMARY OF THE INVENTION

A first aspect of the present invention is directed to a semiconductor device comprising an interlayer insulation film provided on a substrate, an upper wiring patterned on the interlayer insulation film, and a sidewall formed to a side face of the upper wiring, wherein the sidewall is formed of an insulating material.

A second aspect of the present invention is directed to the semiconductor device according to the first aspect of the present invention, further comprising a cell plate provided through a dielectric film in a region including surfaces of the upper wiring and the sidewall, and a capacitor formed by the upper wiring, the dielectric film and the cell plate.

A third aspect of the present invention is directed to the semiconductor device according to the first or second aspect of the present invention, wherein the upper wiring has a lamination structure including a barrier metal and a conductive wiring pattern, the barrier metal abutting on a contact provided through the interlayer insulation film.

A fourth aspect of the present invention is directed to the semiconductor device according to the first or second aspect of the present invention, wherein the upper wiring has a lamination structure including a barrier metal and a conductive wiring pattern, the barrier metal abutting on a contact provided through the interlayer dielectric film.

A fifth aspect of the present invention is directed to the semiconductor device according to the first or second aspect of the present invention, wherein a first region of a contact provided through the interlayer insulation film is superposed on the upper wiring and a recess is generated in a second region of the contact which has a surface formed in a lower position than a formation position of a surface of the first region and is not superposed on the upper wiring, a part of the sidewall being buried in the recess.

A sixth aspect of the present invention is directed to the semiconductor device according to the first or second aspect of the present invention, wherein a first region of a contact provided through the interlayer dielectric film is superposed on the upper wiring and a recess is generated in a second region of the contact which has a surface formed in a lower position than a formation position of a surface of the first region and is not superposed on the upper wiring, a part of the sidewall being buried in the recess.

A seventh aspect of the present invention is directed to a method for manufacturing a semiconductor device, comprising the steps of providing an interlayer insulation film on a substrate, patterning an upper wiring on a surface of the interlayer insulation film, providing an insulating film on the surface of the interlayer insulation film including a surface of the upper wiring, and performing anisotropic etching for the insulating film to obtain a sidewall formed to a side face of the upper wiring.

A eighth aspect of the present invention is directed to the method for manufacturing a semiconductor device according to the fifth aspect of the present invention, further comprising the steps of providing a dielectric film in a region including the surface of the upper wiring and a surface of the sidewall, and forming a cell plate on a surface of the dielectric film, thereby obtaining a capacitor formed by the upper wiring, the dielectric film and the cell plate.

Effects of the present invention will be described below.

According to the first aspect of the present invention, the insulating sidewall is formed on the side face of the upper wiring so that an absolute height difference between the upper wiring and the interlayer insulation film can be reduced. Thus, a gradient of a height difference portion can be reduced. Consequently, the upper layer can be formed with a good coverage on the interlayer insulation film including the surfaces of the upper wiring and the sidewall. Furthermore, the sidewall is formed of the insulating film. Consequently, it is also possible to prevent the adjacent wirings from being short-circuited.

According to the second aspect of the present invention, when the dielectric film and the cell plate should be provided on the upper wiring acting as a storage node to form the capacitor, film formation can be performed with a good coverage because the surface of the sidewall provided on the side face of the upper wiring is gently slanted and the surface is flattened.

According to the third aspect of the present invention, the following effects can be obtained in addition to the effects obtained in the first or second aspect of the present invention. More specifically, the upper wiring and the semiconductor substrate can be electrically connected through the contact formed on the interlayer insulation film. Furthermore, the upper wiring is formed by the wiring pattern and the barrier metal provided on a bottom face of the wiring pattern. Thus, the contact and the upper wiring can be connected well.

According to the fourth aspect of the present invention, the following effects can be obtained in addition to the effects obtained in the first or second aspect of the present invention. More specifically, the upper wiring and the semiconductor substrate can be electrically connected through the contact formed on the interlayer dielectric film. Furthermore, the upper wiring is formed by the wiring pattern and the barrier metal provided on a bottom face of the wiring pattern. Thus, the contact and the upper wiring can be connected well.

According to the fifth aspect of the present invention, also in the case where a shift of superposition is caused between the upper wiring and the contact provided through the interlayer insulation film so that the recess is generated in an upper portion of the contact, the recess is filled with the sidewall so that the surface height difference can be reduced and the surface can be flattened. Thus, the upper layer can be provided on the upper wiring with a good coverage.

According to the sixth aspect of the present invention, also in the case where a shift of superposition is caused between the upper wiring and the contact provided through the interlayer dielectric film so that the recess is generated in an upper portion of the contact, the recess is filled with the sidewall so that the surface height difference can be reduced and the surface can be flattened. Thus, the upper layer can be provided on the upper wiring with a good coverage.

According to the seventh aspect of the present invention, the step of forming the insulating sidewall on the side face of the upper wiring is performed after the upper wiring is formed. Consequently, the surface is flattened. Thus, the coverage of the upper layer to be provided at the next step can be enhanced.

According to the eighth aspect of the present invention, the following effects can be obtained in addition to the effects obtained in the fifth aspect of the present invention. More specifically, the upper wiring is used as the storage node of the capacitor, and the dielectric film can be provided with a good coverage on the flattened surface formed by the upper wiring and the storage node.

In order to solve the above-mentioned problems, it is an object of the present invention to provide an excellent semiconductor device comprising an upper wiring having a surface height difference reduced and capable of forming an upper layer with a good coverage wherein a plurality of upper wirings are continuously arranged and a distance between the wirings can be reduced to a minimum dimension without a short circuit caused between the wirings.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a view showing the prior art.

DESCRIPTION OF THE PREFERRED EMBODIMENTS

First Embodiment

A first embodiment of the present invention will be described below.

Figure 1:
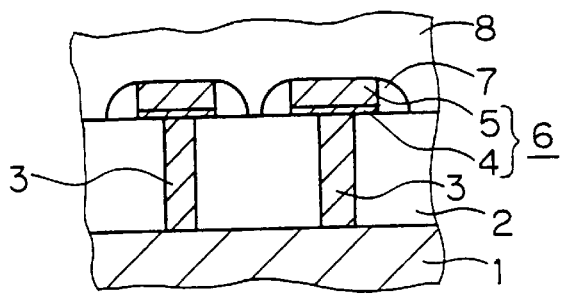
FIG. 1 is a view showing a semiconductor device according to a first embodiment of the present invention.

FIG. 1 is a view showing a sectional structure of a semiconductor device formed according to the first embodiment of the present invention, in which an upper wiring is patterned on a surface of an interlayer insulation film provided on a substrate and an upper layer is formed with a good coverage on a top face of the upper wiring.

In FIG. 1, the reference numeral 1 denotes a semiconductor substrate, the reference numeral 2 denotes an interlayer insulation film provided on the semiconductor substrate 1, the reference numeral 3 denotes a contact made of a conductive material which is formed through the interlayer insulation film 2, the reference numeral 4 denotes a barrier metal which is patterned on the interlayer insulation film 2 and abuts on the contact 3, and the reference numeral 5 denotes a wiring pattern provided on a top layer of the barrier metal 4. An upper wiring 6 is formed by the barrier metal 4 and the wiring pattern 5.

Furthermore, a side face of the upper wiring 6 is covered with a sidewall 7 made of an insulating material. A surface height difference between the upper wiring 6 and the interlayer insulation film 2 has a small gradient with the sidewall 7 formed. Consequently, an upper layer 8 can be formed with a good coverage on a surface of the upper wiring 6.

A method for manufacturing the semiconductor device shown in FIG. 1 will be described below with reference to FIGS. 2(a) to 2(d).

Figure 2:
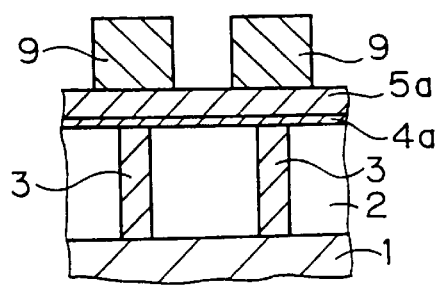
FIGS. 2(a) to 2(d) are views showing a process for manufacturing the semiconductor device according to the first embodiment of the present invention.
Figure 2:
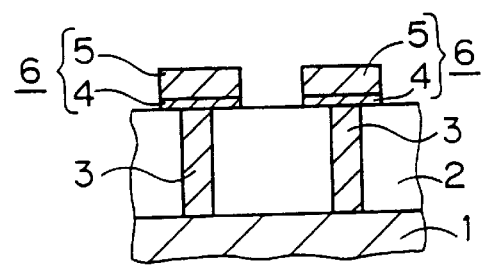
Figure 2:
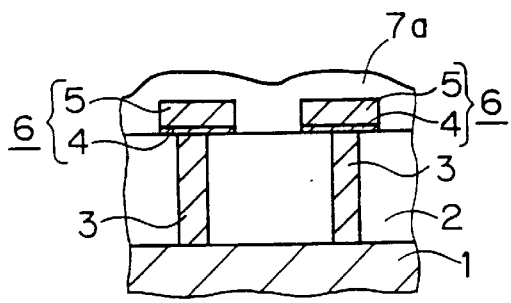
Figure 2:
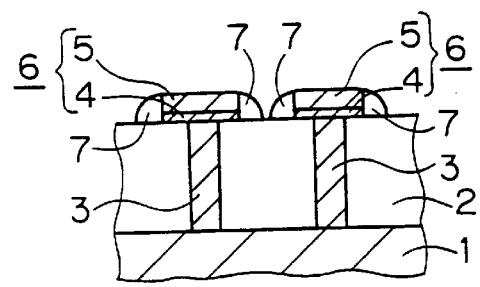

First of all, an active element is formed in a surface region of the semiconductor substrate 1 as shown in FIG. 2(a). Then, an interlayer insulation film 2 comprising a silicon oxide film having a thickness of about 6000 Å is provided. Thereafter, a contact hole is provided through the interlayer insulation film 2 to partially expose a surface of the active element. Subsequently, doped polysilicon is buried in the contact hole. Thus, a contact 3 is obtained. The doped polysilicon remaining on a surface of the interlayer insulation film 2 is removed by CMP (chemical mechanical polishing).

Then, a barrier metal layer 4a is formed on the surface of the interlayer insulation film 2. The barrier metal layer 4a is formed by a laminated film including a titanium nitride film having a thickness of about 500 Å and a titanium film having a thickness of about 300 Å. Furthermore, a tungsten layer 5a having a thickness of about 1000 Å is provided on a surface of the barrier metal layer 4a. Thereafter, a resist pattern 9 having a shape corresponding to an upper wiring 6 is formed on a surface of the tungsten layer 5a.

As shown in FIG. 2(b), the tungsten layer 5a and the barrier metal layer 4a are sequentially subjected to anisotropic etching by using the resist pattern 9 as an etching mask. Consequently, the upper wiring 6 is patterned. After the etching, the resist pattern 9 is removed.

Then, a TEOS (tetraethyl orthosilicate) oxide film 7a having a thickness of about 1500 Å is provided as shown in FIG. 2(c).

As shown in FIG. 2(d), the TEOS oxide film 7a is subjected to etching by the RIE (reactive ion etching) method. Consequently, a sidewall 7 is bonded to a side face of the upper wiring 6.

A surface of the sidewall 7 is gently slanted from a top face of the upper wiring 6 to the surface of the interlayer insulation film 2.

The sidewall 7 has a maximum vertical dimension which is equivalent to a thickness of the upper wiring 6. Therefore, the vertical dimension can be reduced by a thickness of the protective pattern 106 as compared with the case according to the prior art shown in FIG. 6. Consequently, a surface height difference can be reduced. In addition, a gradient of the surface of the sidewall 7 can be reduced. Thus, a flat surface can be obtained.

Then, an upper layer 8 is formed on the surfaces of the upper wiring 6, the sidewall 7 and the interlayer insulation film 2. In this case, film formation can be performed with a good coverage because a laminated face of the upper layer 8 is flattened.

As shown in FIG. 1 and FIGS. 2(a) to 2(d), in the case where a plurality of upper wirings 6 are closely arranged and a distance between the wirings 6 has a minimum dimension, the wirings 6 are short-circuited through the sidewall 7 if the sidewall 7 is made of a conductive material. However, the sidewall 7 is made of an insulating material in the semiconductor device according to the first embodiment. Therefore, there is no possibility that the wirings might be short-circuited.

Furthermore, a contact layer pattern made of a conductive material does not need to be bonded to a bottom face of the sidewall 7. Also in this respect, there is no possibility that the wirings might be short-circuited.

While the sidewall 7 has been made of the insulating material comprising the TEOS oxide film as described above, it can be made of other nonconductive materials. For example, a silicon nitride film, and a composite film including the silicon nitride film and a silicon oxide film can be used.

Similarly, the wiring pattern 5 can be made of doped polysilicon, Pt, WSi, TiSi, MoSi, Al, AlCu and the like, or their laminated films in addition to tungsten.

The contact 3 can be made of a conductive material such as TiN, Ti, Pt, Ru, $RuO_2$, WSi, TiSi, MoSi, Al, AlCu and the like, or their laminated films in addition to doped polysilicon.

Second Embodiment

A semiconductor device according to a second embodiment of the present invention will be described below.

While the example in which the insulating sidewall 7 is merely formed on the side face of the upper wiring 6 to flatten the surface has been described in the first embodiment, the second embodiment is characterized in that the upper wiring 6 is used as a storage node of a capacitor forming a memory cell of a DRAM and a cell plate is provided on a top layer of the upper wiring 6 through a dielectric film.

Figure 3:
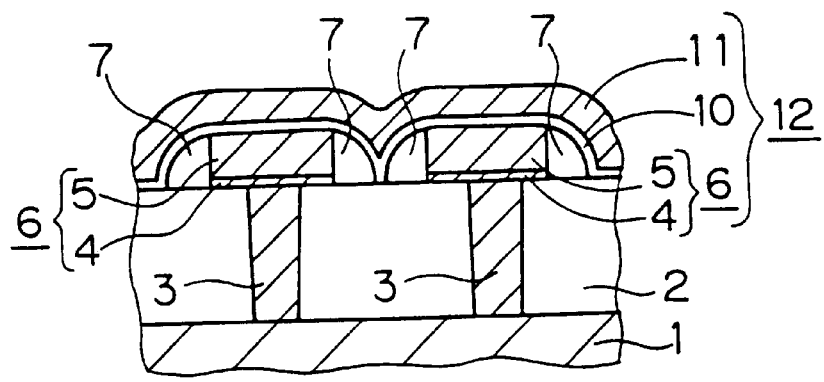
FIG. 3 is a view showing a semiconductor device according to a second embodiment of the present invention.

FIG. 3 is a sectional view showing the semiconductor device according to the second embodiment of the present invention. In FIG. 3, the reference numeral 10 denotes a dielectric film provided on a surface of the upper wiring 6, the reference numeral 11 denotes a cell plate provided on a surface of the dielectric film 10, and a capacitor 12 is formed by the upper wiring 6, the dielectric film 10 and the cell plate 11. The same reference numerals as those used for the explanation denote the same or corresponding portions.

The semiconductor device shown in FIG. 3 is obtained according to the manufacturing flow shown in FIGS. 2(a) to 2(d) in accordance with the first embodiment. More specifically, the upper wiring 6 and a sidewall 7 are formed, and the dielectric film 10 comprising a BST (BaSrTiO) film having a thickness of about 500 Å is then provided on the surfaces of the upper wiring 6 and the sidewall 7. Thereafter, Pt having a thickness of about 1000 Å is provided as the cell plate 11. The capacitor 12 is formed by the upper wiring 6, the dielectric film 10 and the cell plate 11.

In the case where the upper wiring 6 is used as the storage node of the capacitor 12 as shown in FIG. 3, the sidewall 7 is formed on a side face of the upper wiring 6 so that the surface can be flattened. Therefore, the dielectric film 10 can be formed with a good coverage.

Also in the case where a distance between the adjacent upper wirings 6 has a minimum dimension as described in the first embodiment, they are not short-circuited because the sidewall 7 is made of an insulating material. A conductive contact layer pattern is not formed under the sidewall 7. Also in this respect, there is no possibility that a short circuit might be caused.

While an example in which the BST (BaSrTiO) film is used as the dielectric film 10 has been described above, it is also possible to use an oxide film, a nitride film, and a composite film including the oxide film and the nitride film, a high dielectric film such as tantalum oxide ($Ta_2O_5$) or (Ba, Sr)$TiO_3$, a ferroelectric film such as $BaTiO_3$, $SrTiO_3$, $PbTiO_3$, $LiNbO_3$, PZT or PLZT, and the like.

Third Embodiment

In the first and second embodiments, there has been described the case where a shift of superposition is not caused between the contact 3 provided through the interlayer insulation film 2 and the upper wiring 6 and the whole top face of the contact 3 abuts on the bottom face of the upper wiring 6.

In a third embodiment of the present invention, the case where a shift of superposition is caused between the contact 3 and the upper wiring 6 will be described.

Figure 4A:
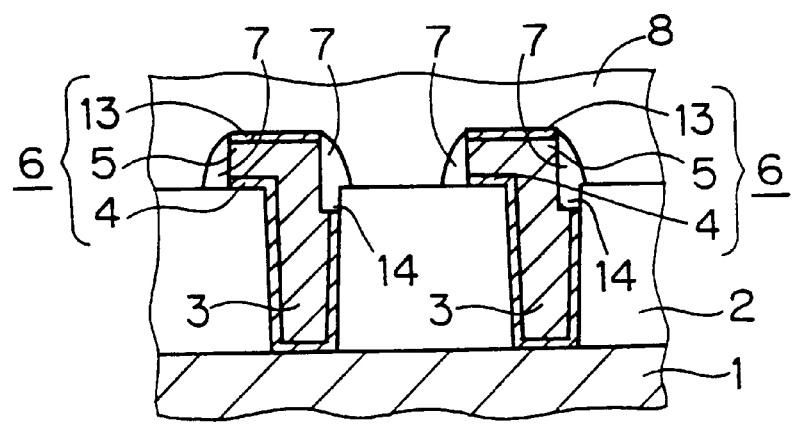
FIGS. 4(a) and 4(b) are views showing a semiconductor device according to a third embodiment of the present invention.

FIG. 4(a) is a sectional view showing a semiconductor device according to the third embodiment of the present invention. The shift of superposition is caused between the upper wiring 6 and the contact 3. Therefore, a part of a top face of the contact 3 is not superposed on the upper wiring 6.

In FIG. 4(a), the reference numeral 13 denotes a conductive film forming the upper wiring 6, which is a barrier metal layer provided on a top face of a wiring pattern 5 made of tungsten, and the reference numeral 14 denotes a recess (concave portion) formed in an upper portion of the contact 3 by etching. A sidewall 7 made of an insulating film is formed to fill in the recess 14. The same reference numerals as those used for the explanation denote the same or corresponding portions.

Figure 4B:
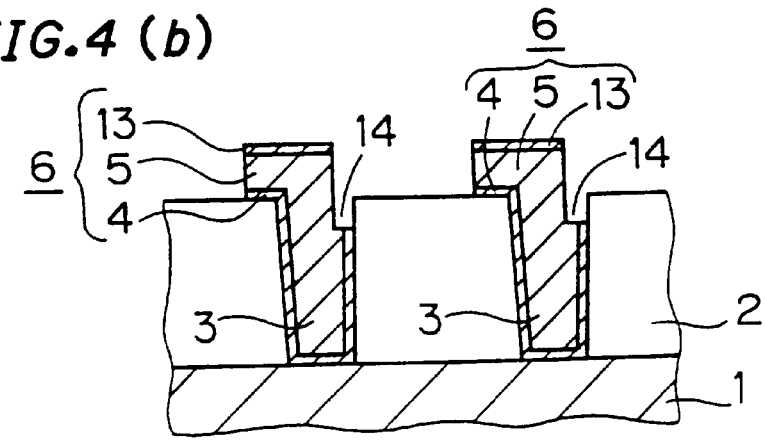

As shown in FIG. 4(b), the recess 14 is formed on a top face of the contact 3 by digging down a region which is not superposed on the upper wiring 6.

A manufacturing method shown in FIGS. 4(a) and 4(b) is as follows. A contact hole is formed through an interlayer insulation film 2 provided on a semiconductor substrate 1. Then, tungsten to act as a barrier metal 4 and a wiring pattern 5 is provided to fill in the contact hole. Thus, a contact 3 is obtained. Furthermore, a barrier metal layer 13 is provided on a surface of the tungsten to act as the wiring pattern 5. Thereafter, a multilayer conductive film provided on a surface of the interlayer insulation film 2 is subjected to patterning by using a mask pattern having a shape corresponding to an upper wiring 6. In the case where a shift of superposition is caused between the contact 3 and the mask pattern during formation of the mask pattern, a portion corresponding to the shift is excessively subjected to etching as shown in FIG. 4(b). Thus, a recess 14 is formed.

As shown in FIG. 4(b), the recess 14 is formed so that a surface height difference is increased by a depth of the recess 14 at a stage where the upper wiring 6 is formed. If an upper layer is to be formed at this stage, a coverage is deteriorated.

In the same manner as in the first embodiment, a sidewall 7 made of an insulating film is formed to flatten a surface. At the same time, the recess 14 is filled with the insulating film to reduce the surface height difference. Consequently, the coverage of an upper layer 8 can be enhanced. Thus, the semiconductor device shown in FIG. 4(a) can be obtained.

Also in the case where the shift of superposition is caused between the contact 3 and the upper wiring 6, the sidewall 7 made of the insulating material is bonded to a side face of the upper wiring 6. Consequently, a surface can be flattened. At the same time, the recess 14 generated in an upper portion of the contact 3 can be filled in. Thus, the surface height difference can be reduced.

The sidewall 7 is made of the insulating material. Therefore, also in the case where a space between the adjacent upper wirings 6 has a minimum dimension, there is no possibility that they might be short-circuited through the sidewall 7. Consequently, a plurality of upper wirings 6 can surely be insulated from each other.

While the example in which the contact hole formed through the interlayer insulation film 2 is filled in and the multilayer conductive film forming the upper wiring 6 is simultaneously provided has been described in the third embodiment, it is apparent that a multilayer conductive film to act as the upper wiring 6 can be provided at another step after the contact 3 is formed in the same manner as in the first embodiment.

Fourth Embodiment

A fourth embodiment of the present invention will be described below.

In a semiconductor device according to the fourth embodiment, a shift of superposition is caused between a contact 3 and an upper wiring 6 in the same manner as in the third embodiment, and the upper wiring 6 is used as a storage node forming a capacitor in the same manner as in the second embodiment. The contact 3 and the upper wiring 6 are made of conductive materials provided at separate steps.

Figure 5:
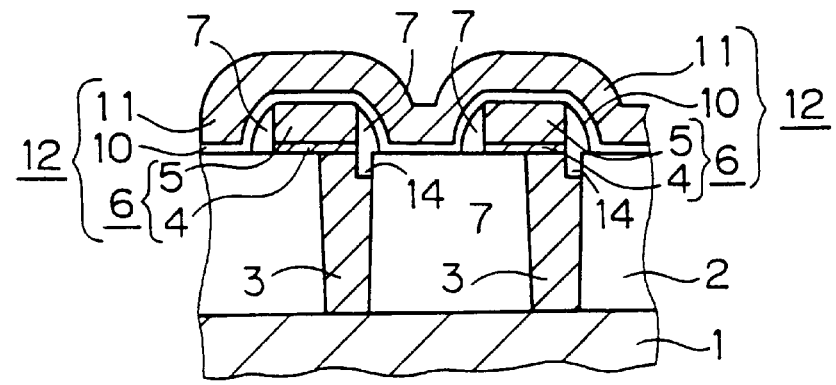
FIGS. 5(a) and 5(b) are views showing a semiconductor device according to a fourth embodiment of the present invention.
Figure 5:
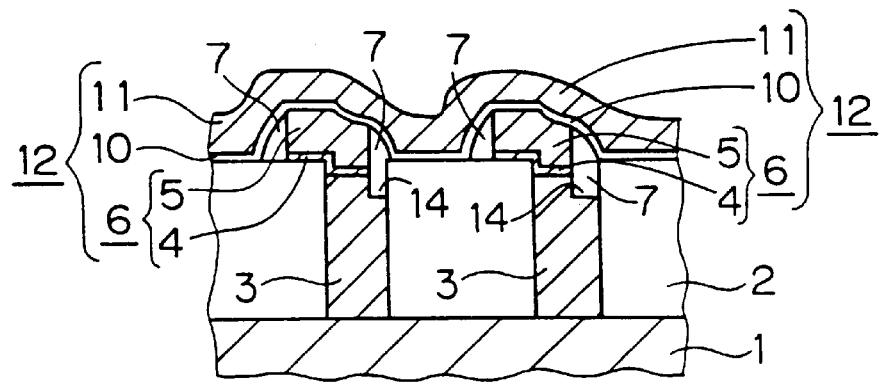
Figure 5:
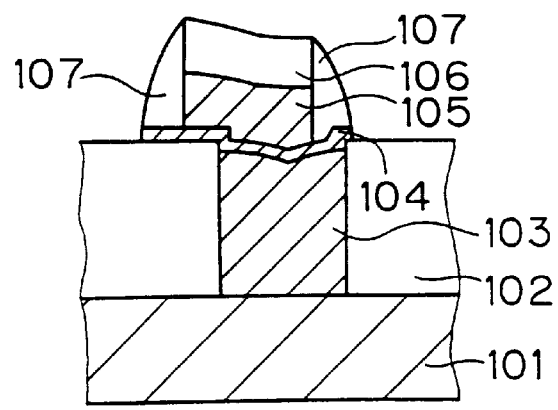

FIG. 5(a) shows the semiconductor device according to the fourth embodiment of the present invention.

In FIG. 5(a), the same reference numerals as those used for the explanation denote the same or corresponding portions. A recess 14 is formed with a part of a top face of the contact 3 dug down. A sidewall 7 is formed to fill in the recess 14.

Also in the fourth embodiment, the sidewall 7 is formed to fill in the recess 14 so that an absolute height difference between the upper wiring 6 and a bottom face of the recess 14 can be eliminated in the same manner as in the third embodiment. Furthermore, a gradient of a height difference portion between a top face of the upper wiring 6 and that of an interlayer insulation film 2 can be reduced. Thus, a surface can be flattened.

Accordingly, a dielectric film 10 and a cell plate 11 can be formed with a good coverage. Consequently, a capacitor 12 having a good shape can be obtained.

Furthermore, the sidewall 7 is made of an insulating material. Therefore, even if a space between the adjacent upper wirings 6 has a minimum dimension, there is no possibility that they might be short-circuited through the sidewall 7. Thus, the upper wirings 6 can surely be insulated from each other.

In FIG. 5(a), the top face of the contact 3 is on a level with a surface of the interlayer insulation film 2 and they form one flat face. In some cases, since an etching selection ratio of the conductive material forming the contact 3 is different from that of a material forming the interlayer insulation film 2, the top face of the contact 3 is excessively subjected to etching to be lower than the top face of the interlayer insulation film 2 when performing etch-back after the contact hole is filled in as shown in FIG. 5(b).

Also in those cases, when a shift of superposition is caused between the contact 3 and the upper wiring 6, the recess 14 is formed in a part of the contact 3. Consequently, a height difference between the top face of the upper wiring 6 and the bottom face of the recess 14 is increased still more. However, the sidewall 7 is formed on a side face of the upper wiring 6 so that the height difference can be reduced. Furthermore, a surface can further be flattened. Consequently, the upper layers such as the dielectric film 10, the cell plate 11 and the like can be formed with a good coverage.

While the upper wiring 6 has been shown as a cell plate forming the capacitor 12 in FIG. 5(b), it is apparent that the same effects can be obtained even if the upper wiring 6 is used as another wiring.

While the invention has been described in detail, the foregoing description is in all aspects illustrative and not restrictive. It is understood that numerous other modifications and variations can be devised without departing from the scope of the invention.

I claim:

1. A semiconductor device comprising:

an interlayer insulation film provided on a substrate;

an upper wiring patterned on said interlayer insulation film;

a sidewall formed to a side face of said upper wiring, wherein said sidewall is formed of an insulating material; and a contact provided through said interlayer insulation film, wherein a first region of said contact is provided through said interlayer insulation film and is superposed on said upper wiring and a recess is formed in a second region of said contact which has a surface formed in a lower position than a formation position of a surface of said first region and is not superposed on said upper wiring, a part of said sidewall is buried in said recess, and said sidewall is formed on a step portion defined by said side face of said upper wiring layer and a surface of said interlayer insulation film.

2. The semiconductor device according to claim 1, further comprising a cell plate provided through a dielectric film in a region including surfaces of said upper wiring and said sidewall; and a capacitor formed by said upper wiring, said dielectric film and said cell plate.

3. The semiconductor device according to claim 1, wherein said upper wiring has a lamination structure including a barrier metal and a conductive wiring pattern, said barrier metal abutting on said contact provided through said interlayer insulation film.

4. The semiconductor device according to claim 2, wherein said upper wiring has a lamination structure including a barrier metal and a conductive wiring pattern, said barrier metal abutting on said contact provided through said interlayer insulation film.

* * * * *